United States Patent [19]

Yamazaki et al.

[11] Patent Number: 5,797,638
[45] Date of Patent: Aug. 25, 1998

[54] HOIST APPARATUS FOR ANNULAR MEMBER

[75] Inventors: Masakazu Yamazaki; Michio Yanaba; Hiroaki Taguchi; Takashi Atami; Hisashi Furuya, all of Tokyo, Japan

[73] Assignees: Mitsubishi Materials Silicon; Mitsubishi Materials Corporation, both of Tokyo, Japan

[21] Appl. No.: 822,489

[22] Filed: Mar. 24, 1997

[30] Foreign Application Priority Data

Mar. 25, 1996 [JP] Japan .................................. 8-068852
May 23, 1996 [JP] Japan .................................. 8-128800

[51] Int. Cl.$^6$ ........................................................ B66C 1/62
[52] U.S. Cl. ..................................... 294/97; 294/67.31
[58] Field of Search .................. 294/93–97, 67.1, 294/67.31, 68.1, 68.3, 81.1, 81.2, 81.51, 86.24

[56] References Cited

U.S. PATENT DOCUMENTS

| 186,943 | 2/1877 | Moore | 294/97 |
| 2,789,859 | 4/1957 | Woellner | 294/97 |
| 2,923,569 | 2/1960 | Milliron | 294/97 |
| 4,474,400 | 10/1984 | Toffolon | 294/97 |
| 5,306,062 | 4/1994 | Dodge | 294/93 |

FOREIGN PATENT DOCUMENTS

| 1408629 | 7/1965 | France | 294/97 |
| 1449-518 | 1/1989 | U.S.S.R. | 294/97 |

*Primary Examiner*—Dean Kramer
*Attorney, Agent, or Firm*—Cushman Darby Cushman IP Group of Pillsbury Madison & Sutro LLP

[57] ABSTRACT

An annular member hoist apparatus which lifts an annular member and carries and positions the annular member at a predetermined location by a carrier apparatus fitted with an elevator mechanism, including a suspension member suspended from the elevator mechanism, and a plurality of support arms which extend out radially in a horizontal plane from the suspension member. Each of the support arms has an engagement tip portion for supporting the annular member from inside the annular member.

10 Claims, 10 Drawing Sheets

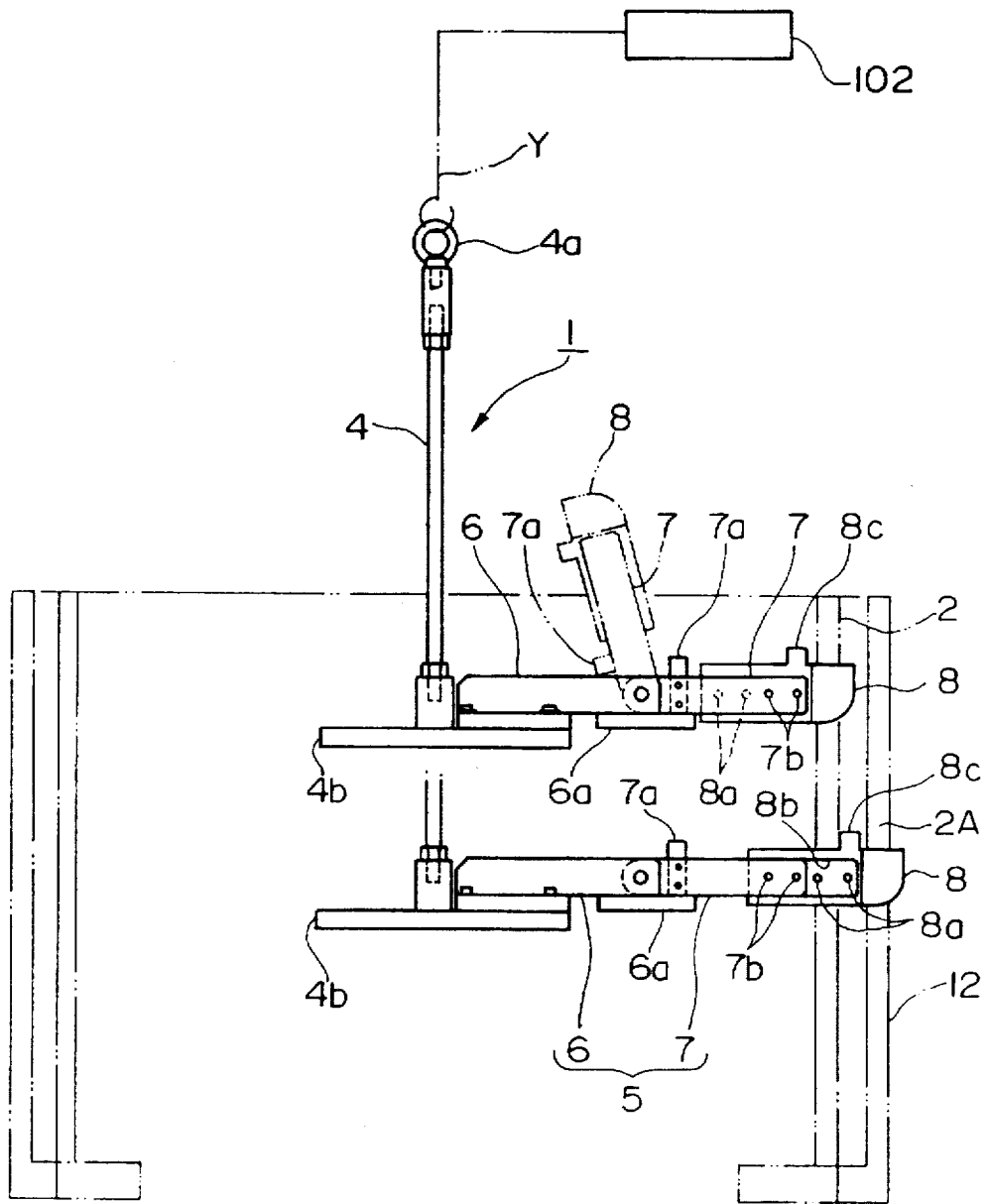

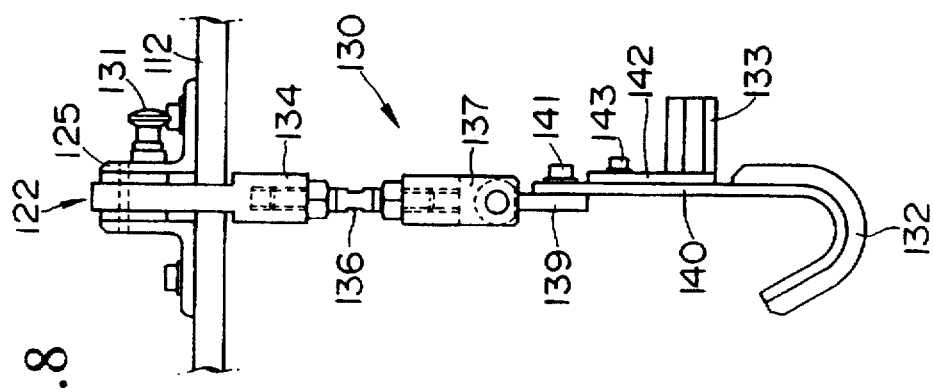

HOIST APPARATUS FOR ANNULAR MEMBER

BACKGROUND OF THE INVENTION

1. Field of the Invention

The present invention relates to an annular member hoist apparatus for lifting an annular member and positioning it at a predetermined location by carrying using a carrier apparatus. In particular the invention relates to a hoist apparatus which is suitable for use with annular members such as the heater and the heat retention cylinder positioned inside the gas tight container of a semiconductor single crystal pulling apparatus.

2. Description of the Related Art

The CZ growth technique is an example of one of the currently known techniques for growing single crystals of semiconductors such as silicon (Si) or gallium arsenide (GaAs). Because this CZ growth technique enables simple generation of large diameter, high purity single crystals which are free from dislocation or have extremely low levels of lattice defect, it is widely used in the growing of a variety of semiconductor crystals.

In recent years, the increase in crystal diameter of single crystals has been accompanied by an increase in the diameter of members such as the crucible for storing the semiconductor melt. As a result, annular members such as the heater which encircles and applies heat to the aforementioned crucible, and the heat retention cylinder, have become very heavy objects with diameters larger than the crucible. A crane is thus used for lifting the heater during installation inside the pulling apparatus, and for subsequent removal. For this purpose, eye bolts are currently fitted to the external surface and upper portion of the annular members at a plurality of locations, and each annular member is then lifted by sling wires connected to the crane through these eye bolts.

The installation and removal operations of the annular members however are still beset with the following type of problem. Because the annular members are supported by a plurality of wires, each wire must be connected to the crane and to the annular member, and hence the connection operation requires considerable time. In particular, in those situations where there is insufficient space to connect the wires to the outside of the annular member so that the wires must be connected to the inside of the member, the connection of the wires is more difficult than when connected to the outside, resulting in poor operability.

SUMMARY OF THE INVENTION

The present invention takes the above problems into consideration, with the object of providing an annular member hoist apparatus in which the operation of positioning an annular member can be completed easily.

With one embodiment of the present invention, a technique is adopted wherein an annular member hoist apparatus which is attached to a carrier apparatus fitted with an elevator mechanism, for lifting and carrying an annular member and positioning the member at a predetermined location is provided with: a suspension member suspended below the elevator mechanism of the carrier apparatus; a plurality of support arms which extend out radially in a horizontal plane from the suspension member; and engagement tip portions for supporting the annular member from inside the annular member provided on the respective support arms.

When lifting an annular member with this hoist apparatus, first the suspension member is connected to the elevator mechanism, and the suspension member is then lowered and positioned inside the annular member. Next, the suspension member is rotated about its axis so that the support arms are positioned at predetermined portions of the annular member. The engagement tip portion of each support arm is then engaged to support the predetermined portion of the annular member. The elevator mechanism is then activated and the hoist apparatus lifted up together with the annular member.

Consequently, the engagement of the engagement tip portions with the annular member can be completed easily by simply rotating the support arms about the suspension member axis and positioning them at the predetermined portions of the annular member.

With this embodiment, the annular member is a cylindrical heater for positioning inside a gas tight container of a semiconductor single crystal pulling apparatus and comprises a plurality of vertical slits which are closed at least at the top end, and the engagement tip portions each comprises an engagement tongue at the extremity of each support arm, which slots into one of the vertical slits from inside the heater and engages at the top edge of the slit, and are made so as to be foldable only in an upwards direction.

With the present hoist apparatus, the arm tip portion of each support arm can be folded only upwards with respect to an arm base portion about a pivot point at the extremity of the arm base portion. Therefore, when the heater suspension jig is lowered down inside the heater with the support arms in an extended position, the arm tip portion of each support arm contacts the upper edge of the heater and folds upwards about the pivot point at the extremity of the arm base portion. Because it is not the entire support arm which contacts the top edge of the heater and folds upwards, but just the arm tip portion, the amount of additional weight applied to the heater, which is made of brittle material such as carbon, is reduced.

Furthermore, preferably the length of the support arms can be adjusted.

With such a hoist apparatus, because the length of the support arms can be adjusted, then in those cases where a heater of different bore diameter is to be lifted and positioned inside the gas tight container, the length of the support arms can be adjusted to match the internal diameter of the heater. Hence the exchange of heaters of differing sizes can be carried out easily.

Moreover, preferably the engagement tongues comprise a locating protrusion which protrudes upwards proximate to either the internal surface or the external surface of the heater when the tongue is slotted into the vertical slit.

With such a hoist apparatus, because a locating protrusion is fitted to each of the engagement tongues, then even if a sideways force is applied to the heater, which is supported at the upper edge of the vertical slits, the locating protrusions will contact either the internal surface or the external surface of the heater, preventing any deviation in the position of the heater.

Furthermore, preferably the support arms comprise an arm base portion with a base end connected to the suspension member, and an arm tip portion which is connected to the extremity of the arm base portion, and the arm tip portion can be folded about a pivot point at the extremity of the arm base portion, in only an upward direction with respect to the arm base portion.

Moreover, preferably the arm tip portions each comprise a fold stopper which protrudes from the top surface of the arm tip portion and which contacts the upper surface of the arm base portion when the arm tip portion is folded upwards. to thus control the extent of folding.

With such a hoist apparatus, because the arm tip portions are fitted with fold stoppers, when the support arms are placed in the folded condition, each of the fold stoppers contacts the upper surface of the arm base portion, thus controlling the extent to which the support arms fold, and preventing the support arms from folding beyond a set angle.

Furthermore, preferably the suspension member has a central portion which is connected to the elevator mechanism of the carrier apparatus, and the support arms are equipped with a plurality of engagement portions at predetermined positions, and each engagement portion is positioned on a circle approximately concentric with a central portion of the suspension member, and hook members having said engagement tip portions are releasably engaged with each engagement portion. Furthermore, each of the hook members is provided with a hook portion which acts as the engagement tip portion, for engaging a bar type member attached to the annular member, and a protruding portion which is part of the hook portion, for engaging the annular member, and is formed with a rotation support portion for supporting the hook portion and the protruding portion so that they can freely rotate about an approximately vertical line.

With this embodiment, each of the hook members is engaged with an engagement portion located at a predetermined position on one of the support arms. The hook members are then rotated with the rotation support portion, and then either the hook portions of the hook members are engaged with the bar type members attached to the annular member, or the protruding portions attached to the hook members are engaged with the annular members, and the suspension member then hoisted up using the carrier apparatus, and the annular member carried to a predetermined position.

BRIEF DESCRIPTION OF THE DRAWINGS

FIG. 2 is an elevation view of the first embodiment of the annular member hoist apparatus of the present invention;

FIG. 7 is an enlarged view of one portion of the second embodiment of the annular member hoist apparatus;

FIG. 8 is a front view of FIG. 7;

DESCRIPTION OF THE PREFERRED EMBODIMENTS

As follows is a description of a first embodiment of an annular member hoist apparatus according to the present invention, with reference to FIGS. 1–5. In these figures, numeral 1 refers to a hoist apparatus, 2 to a heater, 4 to a central axis member, and to a support arm.

A silicon single crystal pulling apparatus incorporating a furnace, is located on the factory floor. A carrier apparatus for supplying the various members which comprise the pulling apparatus, and for carrying items such as the source material, is positioned next to the pulling apparatus.

Figure 4:
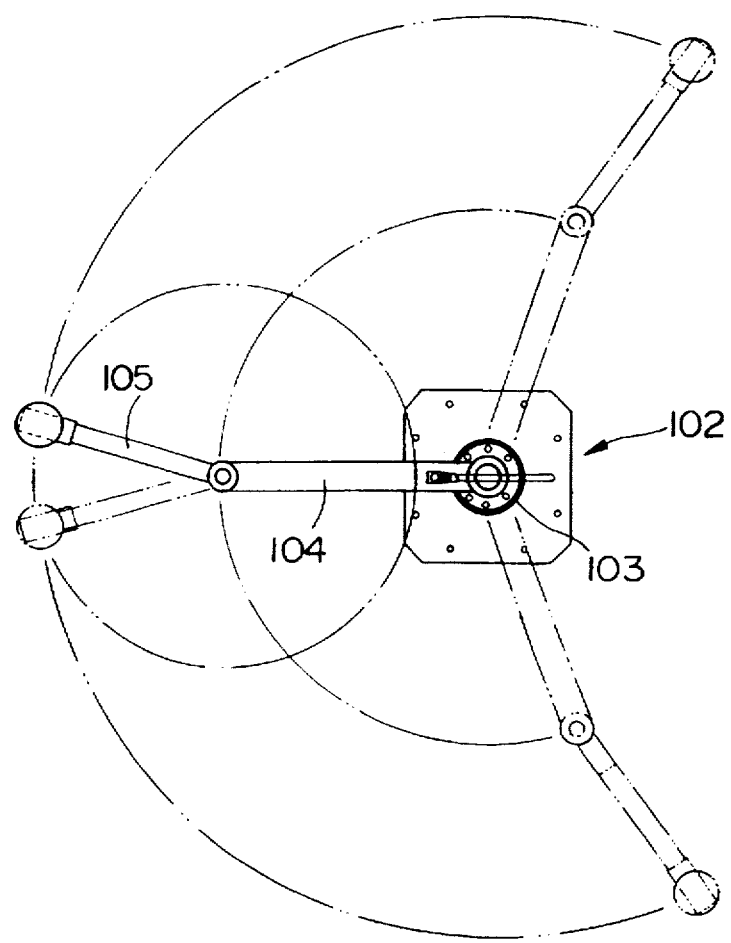
FIG. 4 is a plan view of a carrier apparatus used in the embodiments of the annular member hoist apparatus of the present invention.
Figure 5:
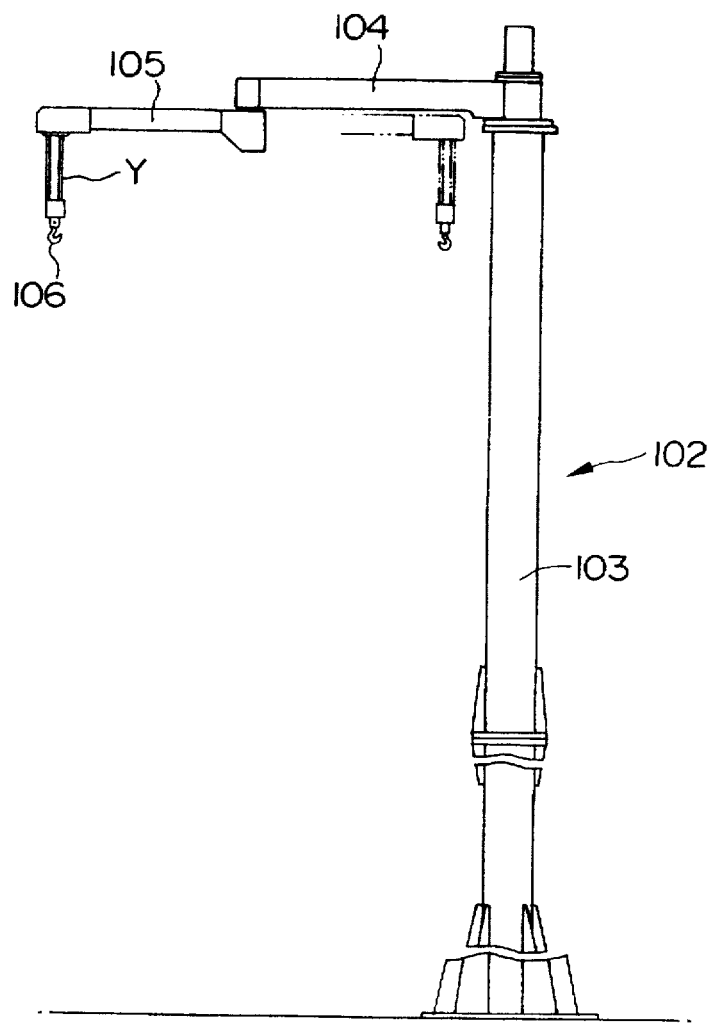
FIG. 5 is an elevation view of FIG. 4.
Figure 6:
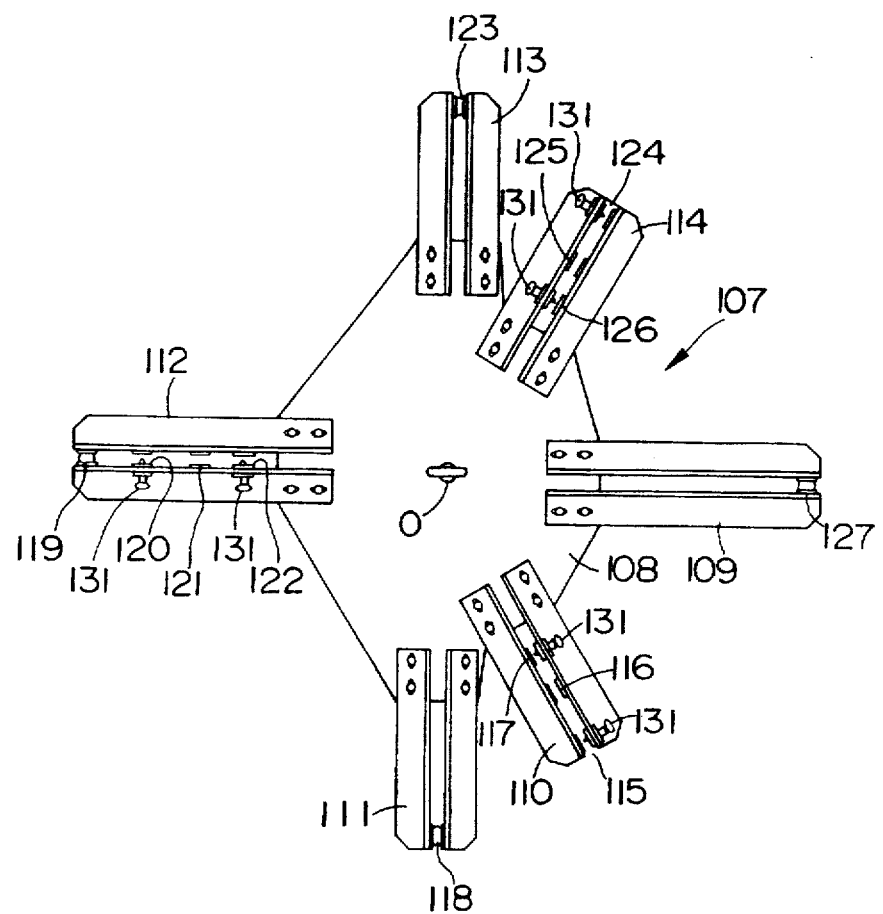
FIG. 6 is a plan view of a second embodiment of an annular member hoist apparatus of the present invention.

Examples of the carrier apparatus include cranes such as those shown in FIGS. 4 and 5. More specifically, the carrier apparatus 102, as shown in FIGS. 4 and 5, comprises a vertical shaft 103 which is fixed to the factory floor, a primary swing arm 104 which is attached to the upper portion of the vertical shaft 103 with free revolving capabilities, a secondary swing arm 105 which is attached to the tip of the primary swing arm 104 with free revolving capabilities, and a hook mechanism (elevator mechanism) 106 which is suspended from the tip of the secondary swing arm on a wire Y. The primary and secondary swing arms 104, 105 are rotated and driven by independent drive mechanisms.

As described beforehand, current heater hoist devices require the attachment of a plurality of hoist members such as eye bolts to the heater for use during the lifting process. Moreover, during operation of a semiconductor single crystal pulling apparatus, because the heater itself becomes very hot, and in order to prevent contamination of the inside of the pulling apparatus by the aforementioned members, these members must be removed following positioning of the heater inside the pulling apparatus, which is time consuming. Furthermore, because the heater is of considerable weight and is made from a brittle material such as carbon, there is a danger that the portions where the members such as the eye bolts are attached will be damaged. This places a constraint on the heater design in that these portions need to display greater strength.

Consequently, the annular member hoist apparatus 1 of the first embodiment, which takes the above problems into consideration, is a hoist apparatus which requires no attachment of hoist members to the heater and yet which enables the simple and stable lifting of the heater during the positioning of the heater inside the pulling apparatus of a semiconductor single crystal pulling apparatus.

Figure 1A:
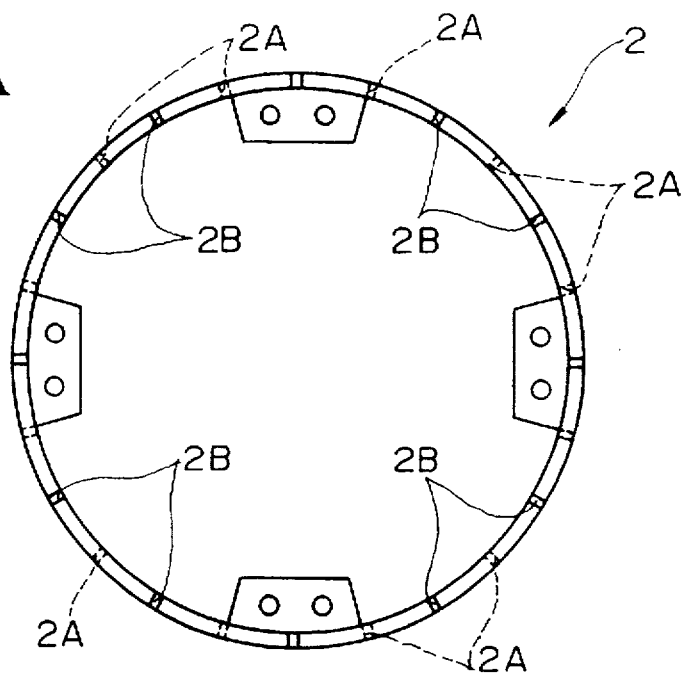
FIGS. 1A and 1B are respective plan and elevation views of a heater used with a first embodiment of an annular member hoist apparatus of the present invention.
Figure 1B:
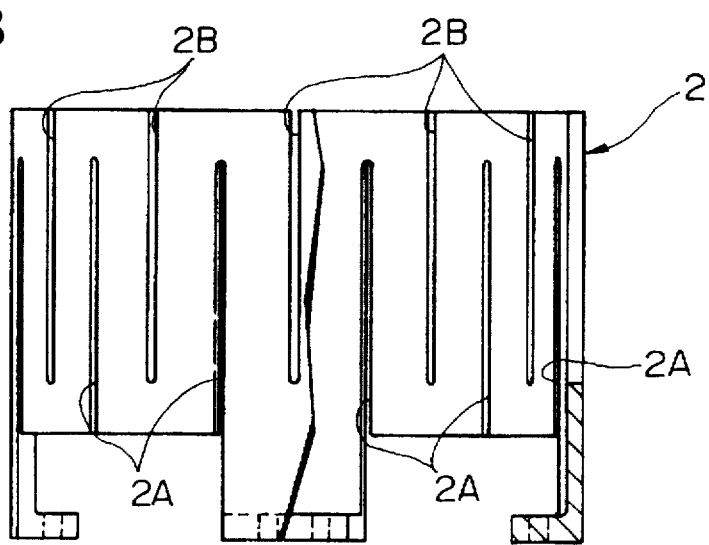

This annular member hoist apparatus 1 is placed inside a gas tight container of a semiconductor single crystal pulling apparatus, and as shown in FIGS. 1A, 1B and FIG. 2, by connection to the wire Y of the hook mechanism 106 of the carrier apparatus 102, hoists a cylindrical heater 2 which is made of carbon and contains a plurality of vertical slits 2A, 2B. The vertical slits 2A, 2B in the heater 2 form an alternating pattern of vertical slits 2A which are closed at the top end and vertical slits 2B which are closed at the bottom end, producing a long electrical current path when an electric current is passed through the heater 2.

Figure 3:
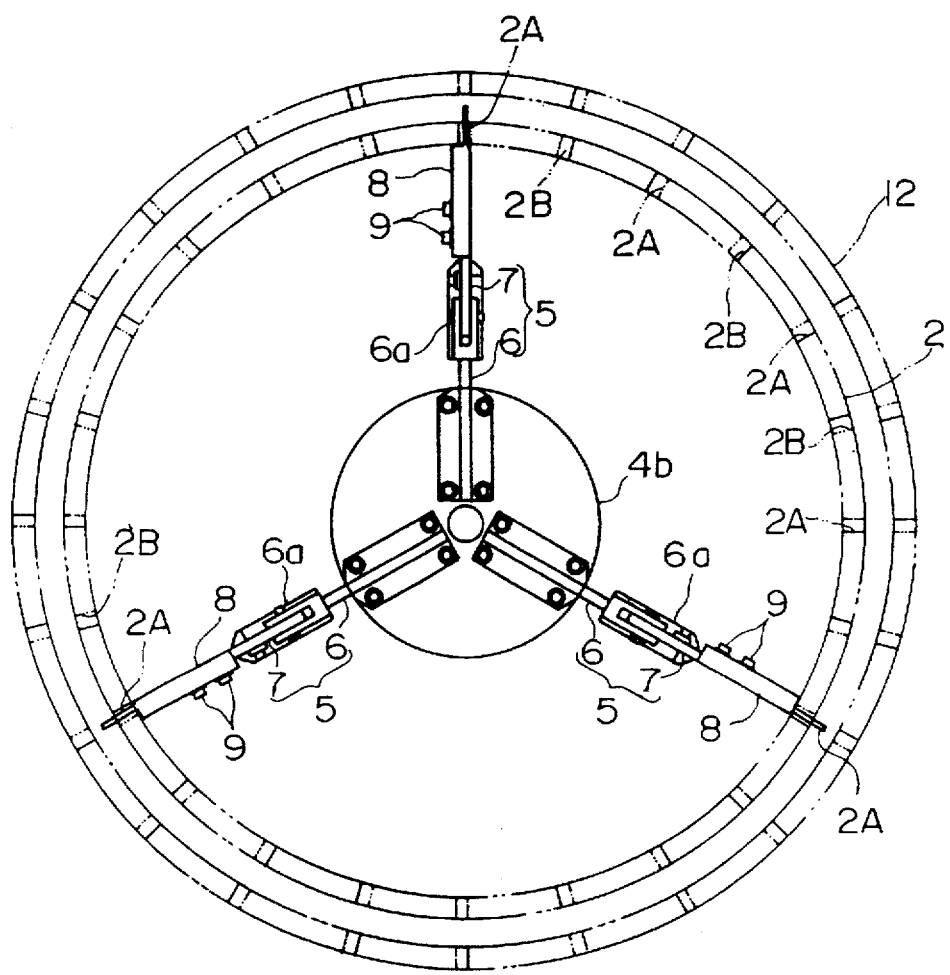
FIG. 3 is a plan view of the first embodiment of the annular member hoist apparatus.

The hoist apparatus 1, as shown in FIGS. 2 and 3, is equipped with a vertically suspended long central axis member (suspension member) 4, the upper portion of which is attached to an eye bolt 4a through which is slung the wire Y, and three support arms 5 which are longer than the radius of the heater 2 and which extend radially outwards in a horizontal plane from base points which are fixed to a circular plate 4b which is fixed to the lower portion of the central axis member 4.

These support arms 5 are positioned around the central axis member with an angle of 120° between the arms, and are comprised of an arm base portion 6 with a base end fixed to the central axis member 4, and an arm tip portion 7 which is in turn connected to the extremity of the arm base portion 6.

Furthermore with the support arms 5, the arm tip portion 7 can be rotated and folded upwards about a pivot point at the extremity of the arm base portion 6, while rotation of the arm tip portion 7 downwards from the extended position is prevented by a supporting plate 6a which is fixed to the lower edge of the tip of the arm base portion 6, thus maintaining the extended position of the arm in a straight horizontal line.

The arm tip portions 7 are each equipped with a rectangular fold stopper 7a on the upper edge for contacting the upper surface of the arm base portion 6, and thus controlling the extent to which the arm tip portion can be folded.

Furthermore, an engagement tongue (engagement tip portion) 8 is attached to, and protrudes outwards from the tip of each of the arm tip portions 7. During hoisting of the heater, each of the engagement tongues 8 slots into one of the vertical slits 2A from inside the heater 2, and engages the upper edge of the vertical slit 2A.

Moreover, the arm tip portions 7 each contain two female screw apertures 7b which are positioned a set distance apart along the direction of the arm extension, while the engagement tongues 8 contain four through apertures 8a which are spaced apart by the same distance as the two female screw apertures 7b.

The engagement tongues 8 each include a lateral recess portion 8b which is of the same width as the arm tip portion 7. The arm tip portion 7 is inserted into the recess portion 8b and attached at a predetermined protrusion distance from the tip of the arm tip portion 7. The length from the axis of the central axis member 4 to the tip of the engagement tongue 8 when the support arm 5 is extended in a straight line position, is set at a length greater than the radius of the heater 2 to be hoisted. Bolts 9 are then inserted through the through apertures 8a and screwed into the female screw apertures 7b, thus fixing the engagement tongue 8 to the arm tip portion 7.

The length of the support arms 5 can be adjusted by changing the through apertures 8a through which the bolts 9 are inserted and then screwed into the female screw apertures 7b to attach the engagement tongue 8.

Furthermore, a rectangular locating protrusion 8c is located on the upper edge of each engagement tongue 8, at a position which is offset slightly inwards from the tip of the tongue 8. The position of the locating protrusion 8c is set so that when the support arm 5 is extended in a straight line position, the length from the axis of the central axis member 4 to the outside edge of the locating protrusion 8c is slightly less than the internal radius of the heater 2 to be hoisted.

Below is an explanation of the technique employed for hoisting a heater 2 using the first embodiment of the annular member hoist apparatus 1 of the present invention.

[Hoist apparatus setting steps]

First, the hoist apparatus 1 is suspended vertically, by connecting the upper portion of the central axis member 4 to the wire Y of the carrier apparatus 102 which is located adjacent to the pulling apparatus (gas tight container), and each of the support arms 5 is folded upwards about the pivot point at the extremity of the arm base portion 6. The hoist apparatus 1 is then positioned at a point above the central axis of a carriage mounted heater 2 and lowered down inside the heater 2 using the carrier apparatus 102.

Following the lowering of the hoist apparatus 1 to a predetermined position inside the heater, the various engagement tongues 8 are aligned by rotating the central axis member 4 about its axis, and the support arms 5 then extended so that in each case the arm base portion 6 and the arm tip portion 7 form a horizontal straight line with the engagement tongue 8 slotting into one of the vertical slits 2A of the heater 2. If the hoist apparatus 1 is then raised in this configuration using the carrier apparatus 102, each of the engagement tongues 8 move up inside the vertical slit 2A and become engaged at the top edge of the vertical slit 2A.

[Heater hoisting process]

If the hoist apparatus 1 is raised up further from the condition described above, the heater 2 can be lifted up off the carriage, supported at the top edge of the vertical slits 2A by the engagement tongues 8. The thus lifted heater 2 is then moved to a position above the pulling apparatus and lowered to a predetermined position inside the pulling apparatus using the carrier apparatus 102, where it is then mounted.

[Hoist apparatus disconnection process]

If the hoist apparatus 1 is lowered still further using the carrier apparatus 102, the engagement tongues 8 move down inside the vertical slits 2A away from the top edge of the slits 2A. Each of the engagement tongues 8 is then removed from the corresponding vertical slit 2A by folding the arm tip portion 7 upwards about the pivot point at the extremity of the arm base portion 6. The hoist apparatus is then lifted upwards again by the carrier apparatus 102 and removed from inside the heater 2 and the pulling apparatus.

If an attempt is made to insert the hoist apparatus 1 inside the heater 2 with the support arms in an extended position with each of the arm base portions 6 and the arm tip portions 7 forming a horizontal straight line, then so long as the support arms are positioned anywhere other than above one of the vertical slits 2B, the arm tip portion 7 of each support arm will contact the top edge of the heater 2 and fold upwards, and thus offer no obstacle to the operation of attaching the hoist apparatus 1 to the heater 2.

At this time, because it is not the entire support arm 5 which contacts the top edge of the heater 2 and folds upwards, but just the arm tip portion 7, the amount of additional weight applied to the heater 2, which is made of brittle material such as carbon, is reduced.

With this hoist apparatus 1 as described above, the engaging of the engagement tongues 8 with the heater 2 during positioning of the heater 2 inside the pulling apparatus and during removal of the heater 2 from the pulling apparatus can be completed easily, by simply rotating the support arms 5 about the axis of the central axis member 4 to align them with predetermined portions of the heater 2.

Furthermore, because the support arms 5 can be folded upwards, the heater 2 can be lifted upwards by first lowering the hoist apparatus 1 down inside the heater 2, extending each of the support arms 5 to a straight line position, engaging the engagement tongues 8 at the top edge of the vertical slits 2A, and then raising the hoist apparatus 1.

Moreover, removal of the hoist apparatus 1 from inside the heater 2 requires simply folding up each of the support arms 5, and then raising the hoist apparatus 1. Consequently, there is no necessity to attach hoist members to the heater 2, and because the heater is supported at the top edge of the vertical slits 2A, there is no necessity to produce special support portions.

Furthermore, by changing the attachment position of the engagement tongue 8, it is possible to adjust the length of the support arms 5, and so in those cases where a heater of different bore diameter is to be lifted and positioned inside the pulling apparatus, the length of the support arms 5 can be adjusted to match the internal diameter of the heater. Hence the exchange of heaters of differing sizes can be carried out easily.

For example, as shown in FIGS. 2 and 3, in the case where a heater 12 with a larger radius than the heater 2 is to be hoisted, the extent of protrusion of each of the engagement tongues 8 is pre-set to a larger value, thus lengthening the support arms 5.

Furthermore, because each of the arm tip portions 7 is fitted with a fold stopper 7a, then when the support arms 5 are placed in the folded position, each of the fold stoppers 7a will contact the upper surface of the associated arm base portion 6, thus controlling the extent to which the support arm 5 will fold, and preventing the support arm from folding beyond a set angle. Thus, the support arm 5 is not folded any more than necessary, and so any interference between the tip of the arm tip portion 7 and the central axis member 4 when the support arm is 5 folded is prevented, and the extension and retraction of the support arm 5 is simplified.

Moreover, because a locating protrusion 8c is provided on the upper edge of each of the engagement tongues 8, then even if a sideways force is applied to the heater 2 which is supported at the upper edge of the vertical slits 2A, the locating protrusions 8c will contact the surface of the heater 2, thus preventing any deviation in the position of the heater 2.

The present invention also covers the following embodiments.

(1) With the first embodiment the support arms 5 were each divided into an arm base portion 6 and an arm tip portion 7. However, provided the support arms can be folded upwards, other configurations are also possible. For example, support arms which are attached so that the base connection point to the central axis member acts as the pivot point, and the whole arm can fold upwards (i.e., the arm is not divided) are also suitable.

(2) With the first embodiment three support arms 5 were attached to the central axis member 4. However, the number of arms is not limited to three, and any multiple of arms is possible. In such a case, each of the arms is positioned at a location corresponding to one of the vertical slits of the heater. For example, four support arms can be positioned around the central axis member with an angle of 90° between the arms, and positioned at locations corresponding to the vertical slits which are closed at the top edge.

(3) The location protrusions 8c were positioned so that during hoisting they were proximate to the internal surface of the heater 2. However these could also be positioned to be proximate to the external surface of the heater. That is, the location protrusions could be formed so that when the engagement tongues are slotted into the vertical slits, they protrude upwards at the tip portions of the engagement tongues which protrude out past the outside surface of the heater. In this case, sideways deviation is prevented by the locating protrusions contacting the external surface of the heater.

In those cases where the there is little distance separating the heater and other members (for example with a heat retention cylinder), it is preferable to position the locating protrusions so that they are proximate to the internal surface of the heater to thereby minimize the amount of protrusion beyond the external surface of the heater.

(4) The length of the support arms 5 was adjusted by altering the distance the engagement tongue protruded out from the arm tip portion. However it is also possible to achieve a similar adjustment by altering a different part of the support arm. For example, the arm base portion could be configured so that its length was adjustable.

Next is a description with reference to FIGS. 6–12, of a hoist apparatus 107 used for positioning other annular members such as a spill tray 150 , a sub shield 151, a heat retention cylinder 152, and an upper ring 153, inside a furnace.

Currently, members such as annular heat retention members have shapes and dimensions which correspond with the shape and dimensions of the various portions of the furnace. Hence it is necessary for the shape and dimensions of the suspension jigs for hoisting the various members to also be different. This means that every time a different member is to be hoisted, the appropriate suspension jig must be used. Consequently, the exchange of suspension jigs takes considerable time, and the management of the various suspension jigs is complicated.

The annular member hoist apparatus 107 of the second embodiment, which in addition to the original problems, takes the above problems into consideration, is an annular member hoist apparatus which can hoist various annular members with a single apparatus, without the provision of various suspension jigs.

The annular member hoist apparatus 107 is equipped with a suspension member 108 which is suspended from the hook mechanism 106 of the previously mentioned carrier apparatus 102, a plurality extension arms (support arms) 109, 110, 111, 112, 113, 114 which extend radially outward from the suspension member 108 in an approximately horizontal plane, and a plurality of engagement portions 115, 116, 117, 118, 119, 120, 121, 122, 123, 124, 125, 126, 127 which are located at predetermined positions on each of the extension arms, and to which freely disengageable hook members 130 can be engaged.

The annular member hoist apparatus 107 is suspended by the previously mentioned hook mechanism 106.

The engagement portions 118, 119, 123, 127 on the extension arms 109, 111, 112, 113 are positioned in an approximate circle centered about the central portion 0 of the suspension member. Furthermore, the engagement portions 115, 120, 124, the engagement portions 116, 121, 125, and the engagement portions 117, 122, 126 on the extension arms 110, 112, 114 are respectively positioned in approximate circles centered about the central portion O of the suspension member.

The engagement portions 115, 116, 117, 118, 119, 120, 121, 122, 123, 124, 125, 126, 127 are formed by positioning sets of angle bars parallel to each another with a predetermined separation, and forming slots therein at corresponding locations. The engagement portions 115, 117, 120, 122, 124, 126, as shown in FIGS. 7 and 8 are each fitted with a screw 131 to prevent removal of the engaged hook member 130.

The hook members 130, as shown in FIGS. 7 and 8, are each equipped with a hook portion (engagement tip portion) 132 for engaging with a bar type member (discussed below) which is attached to the annular member, a protruding portion 133 which is fitted to the hook portion 132 for engaging with the annular member, and a rotation support portion 134 for supporting the hook portion 132 and the protruding portion 133 so that they can freely rotate about an approximately vertical axis.

A pin 135 is fitted to the upper end of each of the rotation support portions 134 for engaging with the previously mentioned engagement portions. Furthermore, the hook portion 132 and the protruding portion 133 are connected to the lower portion of the rotation support portion 134 via a turn buckle 136. Ball bearings (not shown in the drawing)

are located inside the turn buckle 136 to reduce friction during rotation.

Each hook portion 132 is connected to the corresponding turn buckle 136 via a connection member 137 and a pin 138 so as to be free to swing. The hook portion 132 is formed by using a bolt 141 to fasten a J shaped hook plate 140 to a base member 139 which is connected by the pin 138 so as to be free to swing. The protruding portion 133 is formed by using bolts 143 to secure a protrusion plate 142 to the vertical portion of the hook plate 140 so that the plate 142 extends out in a direction approximately orthogonal to the direction of the hook plate 140. A bearing plate 144 is bolted to the tip portion of the protrusion plate 142.

Next is a description of the technique employed in using the second embodiment of the annular member hoist apparatus of the present invention.

Figure 12:
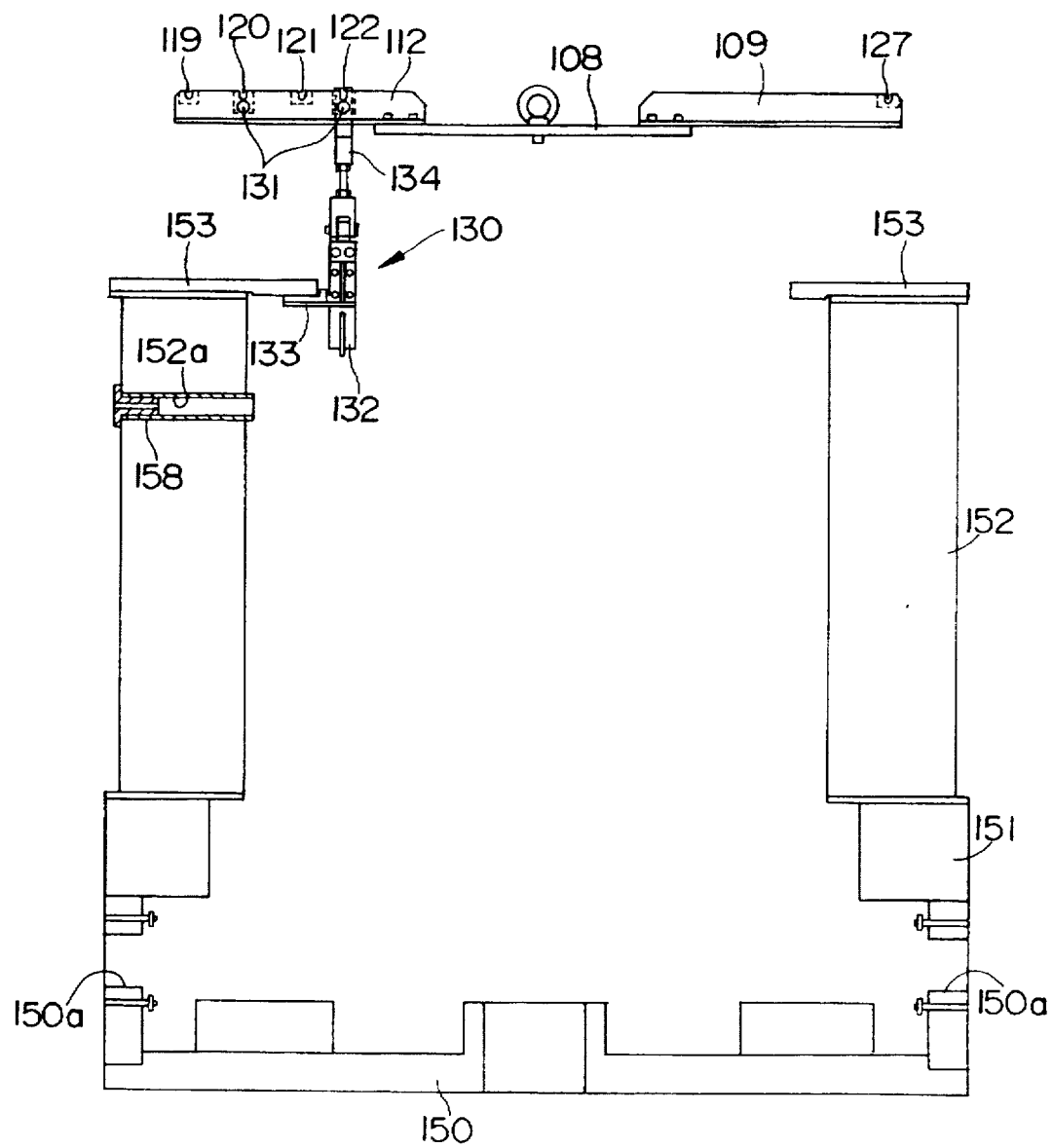
FIG. 12 is a further diagram illustrating the technique for using the second embodiment of the annular member hoist apparatus.

The furnace used with the annular member hoist apparatus 107 is configured by building up a plurality of different annular members, by positioning a bottom annular member and then sequentially placing each subsequent annular member on top of the previous one, as shown in FIG. 12. Thus, the furnace is formed by placing a sub shield 151 on to a spill tray 150, positioning a heat retention cylinder 152 on an upper portion of the sub shield 151, and then mounting an upper ring 153 onto an upper surface of the heat retention cylinder 152.

Figure 10:
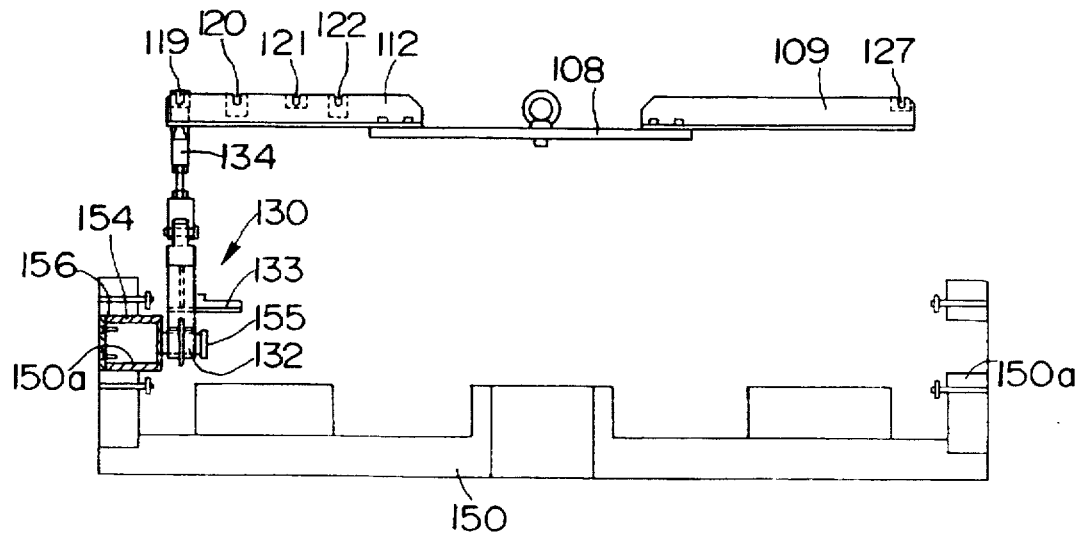
FIG. 10 is a further diagram illustrating the technique for using the second embodiment of the annular member hoist apparatus.

First, the spill tray 150 is positioned at the bottom as shown in FIG. 10. Four through apertures 150a are located at four equally spaced points around the circumference of the spill tray 150. A bar type member 154 is inserted into each of these through apertures 150a. Each of the bar type members 154 comprises a hollow base portion 156 with a protrusion 155 formed on an end of the base portion 156. The base portion 156 is inserted into one of the through apertures 150a.

The suspension member 108 is suspended from the hook mechanism 106 of the carrier apparatus 102. The hook members 130 are then engaged with the engagement portions 118, 119, 123, 127 of the extension arms 109, 111, 115, 113 which extend out from the suspension member 108, and the suspension member 108 gradually lowered and moved to a position proximate to the bar type members 154. The extension arms 109, 111, 115, 113 are then rotated about the axis of the suspension member 108 and positioned so that the various hook portions 132 of the hook members 130 engage with the protrusions 155 of the bar type members 154. Next, the hook mechanism 106 of the carrier apparatus is lifted upwards, and the primary and secondary swing arms 104, 105 swung around to move the spill tray 150 to the desired position, where it is then lowered into place.

Figure 9:
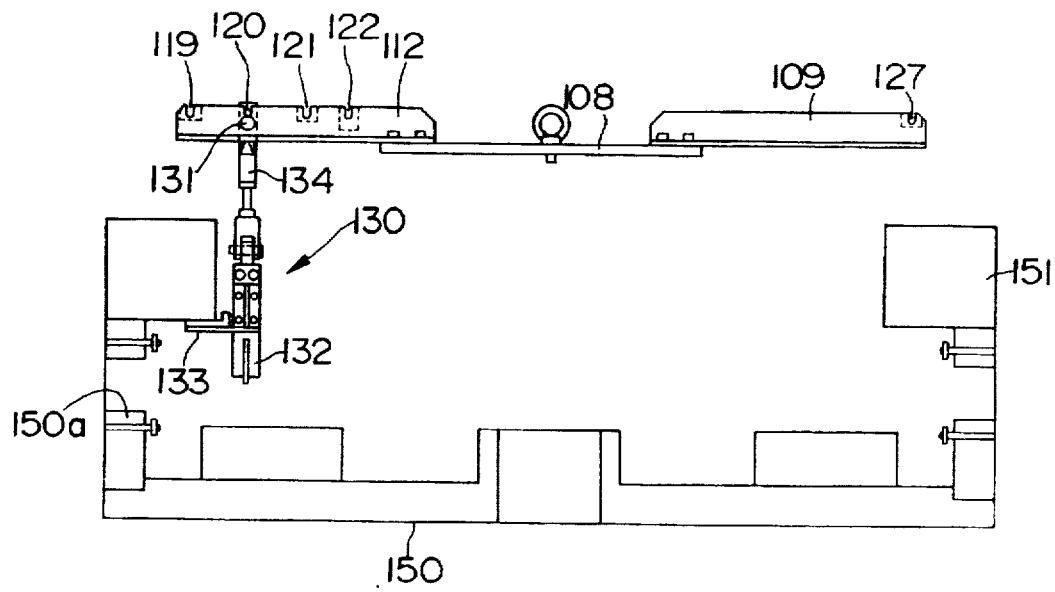
FIG. 9 is a diagram illustrating a technique for using the second embodiment of the annular member hoist apparatus.

Next the sub shield 151 is positioned on top of the spill tray 150 as shown in FIG. 9. The sub shield 151 is an annular member with a rectangular cross-section. The hook members 130 are now moved across to the engagement portions 115, 120, 124 and fastened with the screws 130 fitted to each of the engagement portions. The hook mechanism 106 of the carrier apparatus is then lowered, thus lowering the suspension member 108 to a point where the protruding portions 133 of the hook members 130 are at a position below the bottom edge of the sub shield 151. Each of the protruding portions 133 are then rotated through approximately 90° about the rotation support portion 134 of the hook member 130, to a position where the protruding portions 133 are facing the bottom edge of the sub shield 153. The hook mechanism 106 is then raised, engaging the protruding portions 133 with the bottom edge of the sub shield 151, thus hoisting up the sub shield 151. The primary and secondary swing arms 104, 105 are then swung round to carry the sub shield 151 to the desired location, where it is then lowered into place.

Figure 11:
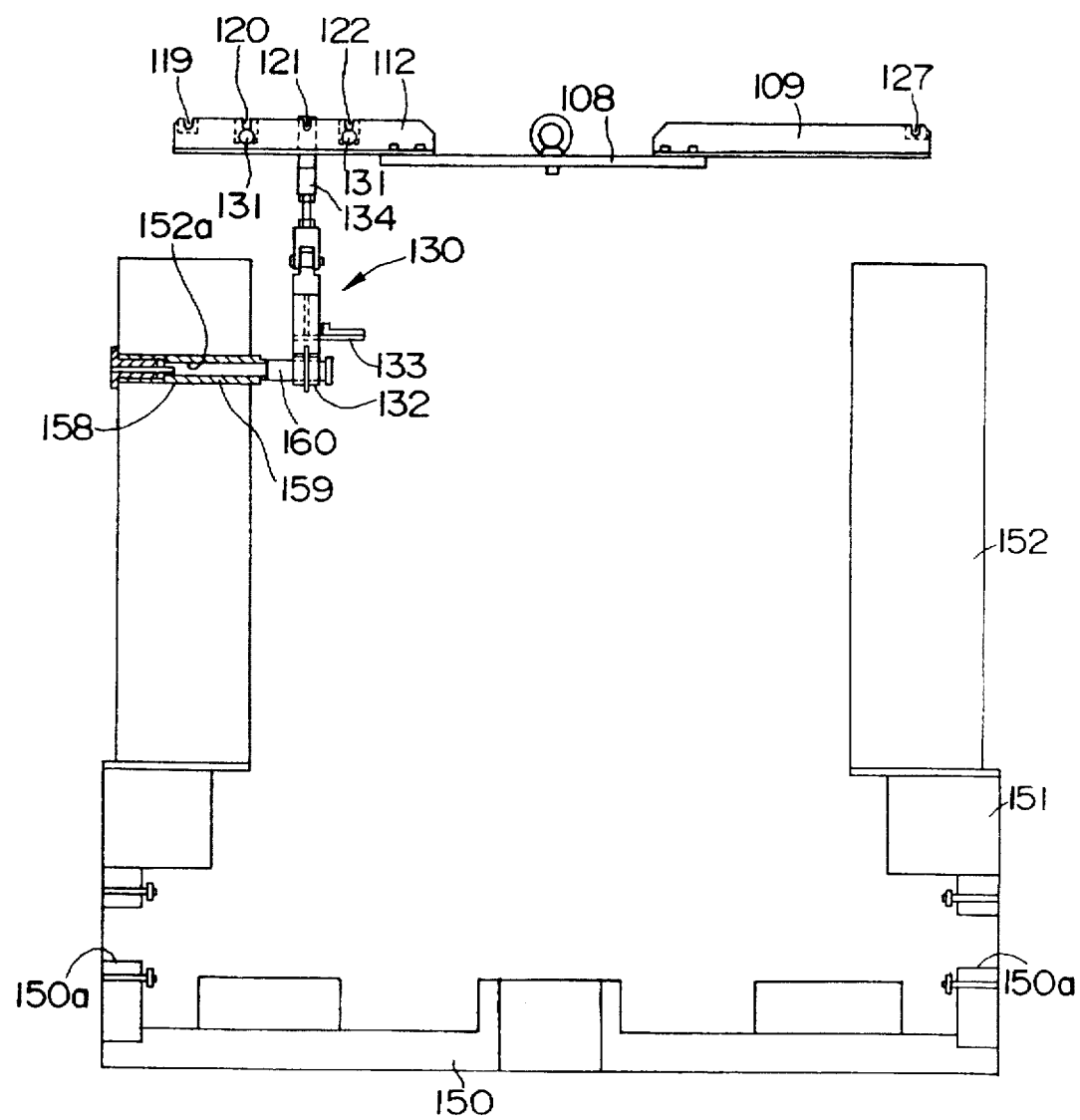
FIG. 11 is a further diagram illustrating the technique for using the second embodiment of the annular member hoist apparatus.

Next the heat retention cylinder 152 is positioned on the upper portion of the sub shield 151 as shown in FIG. 11. Three through apertures 152a are located at three equally spaced points around the circumference of the heat retention shield 152, and a cylindrical member 158 is inserted in each of the through apertures 152. First, a bar type member 159 is inserted into each of the cylindrical members 158 inside the through apertures 152a, so that in each case the tip portion 160 on the extremity of the bar type member 159 protrudes out from the cylindrical member 158.

The hook members 130 are then moved across to the engagement portions 116, 121, 125, and the suspension member 108 gradually lowered and moved to a position proximate to the tip portions 160 of the bar type members 159. The hook portions 132 of the hook members 130 are then engaged with the tip portions 160 of the bar type members 159. Next, the hook mechanism 106 of the carrier apparatus is moved upwards, and the primary and secondary swing arms swung around to move the heat retention cylinder 152 to the desired location, where it is then lowered into place.

Finally, the upper ring 153 is positioned on the upper surface of the heat retention cylinder as shown in FIG. 12. The upper ring 153 is an annular shaped member. The hook members 130 are moved across to the engagement portions 117, 122, 126 and fastened with the screws 130 fitted to each of the engagement portions. Next, the hook mechanism 106 of the carrier apparatus is lowered, thus lowering the suspension member 108 to a point where the protruding portions 133 of the hook members 130 are at a position below the bottom edge of the upper ring 153. Each of the protruding portions 133 are then rotated through approximately 90° about the rotation support portion 134 of the hook member 130 to a position where the protruding portions 133 are facing the bottom edge of the upper ring 153. The hook mechanism 106 is then raised, engaging the protruding portions 133 with the bottom edge of the upper ring 153, thus hoisting up the upper ring 153. The primary and secondary swing arms 104, 105 are then swung around to carry the upper ring 153 to the desired location, where it is then lowered into place.

By using the annular member hoist apparatus of the second embodiment, and engaging the hook members 130 on to selected engagement portions 115~127 of the extension arms 109~114 which extend outwards from the suspension member 108, annular members of different shapes and dimensions (spill tray 150, sub shield 151, heat retention cylinder 152, upper ring 153) can be hoisted and moved to the desired locations.

Consequently, it is not necessary to provide separate suspension jigs for each member, and exchange of suspension jigs is also unnecessary. Thus, by the simple operation of moving the hook members 130, all of the various annular members can be accommodated. Hence, operation efficiency is improved markedly, and management of the jig also becomes a simple matter.

The present invention has the following effects.

One embodiment of the present invention enables the engagement of the engagement tip portions on to the annular member, carried out during the hoisting of the annular member, to be completed easily by simply rotating the support arms about the suspension member axis and positioning them at predetermined portions of the annular member, thus enabling a performance improvement in the hoisting operation.

With this embodiment, each of the support arms is able to be folded upwards. Therefore, a heater can be hoisted up by extending each of the support arms to a straight line position, and engaging the engagement tongues with the upper edge of vertical slits in the heater. Furthermore, to remove the hoist apparatus from the heater, the support arms simply need to be folded up again. Consequently, there is no necessity to attach hoist members to the heater, nor to form special support portions on the heater, and the operation of hoisting and positioning the heater can be completed easily and in a stable manner.

Furthermore, because the length of the support arms can be adjusted, the invention can be suitably used with heaters of all sizes, and even of differing bore diameters, by adjusting the length of the support arms to match the internal diameter of the heater.

Moreover, because the engagement tongues are each equipped with a locating protrusion, then even if a sideways force is applied to a heater which is supported at the upper edge of the vertical slits, the locating protrusions will contact either the internal surface or the external surface of the heater, preventing any sideways deviation, and thus enabling stable hoisting of the heater.

Furthermore, since the arm tip portions are able to fold upwards, then when the support arms are lowered into the heater with the support arms in an extended position, because it is not the entire support arm which contacts the top edge of the heater and folds upwards, but just the arm tip portion, then the amount of additional weight applied to the heater is small, and so damage to the external appearance of the heater is unlikely.

In addition, fold stoppers are fitted to each of the arm tip portions, to prevent the folding of the support arms beyond what is necessary. The fold stoppers thus prevent interference between the bent arm tip portions and the suspension member, and improve the performance of the support arm extension and retraction operations.

With the other embodiment of the present invention, the suspension member has a central portion which is connected to the elevator mechanism of the carrier apparatus, and the support arms are equipped with a plurality of engagement portions at predetermined positions, and each engagement portion is positioned on a circle approximately concentric with a central portion of the suspension member, and hook members which constitute the engagement tip portions are engaged with each engagement portion so as to be freely disengaged. Furthermore, each of the hook members is provided with a hook portion which acts as the engagement tip portion, for engaging a bar type member attached to the annular member, and a protruding portion which is part of the hook portion, for engaging the annular member, and a rotation support portion for supporting the hook portion and the protruding portion so that they can freely rotate about an approximately vertical line is provided. Therefore, various members can be hoisted using a single apparatus, without the need to prepare various suspension jigs.

Finally, the present application claims the priorities of Japanese Patent Applications No. Hei-8-68852 filed Mar. 25, 1996 and No. Hei-8-128800 filed May 23, 1996, which are herein incorporated by reference.

What is claimed is:

1. An annular member hoist apparatus which is attached to a carrier apparatus fitted with an elevator mechanism, for lifting and carrying an annular member and positioning the annular member at a predetermined location, said hoist apparatus comprising:

a suspension member suspended below the elevator mechanism of said carrier apparatus, and a plurality of support arms which extend out radially in a horizontal plane from said suspension member, and each of said support arms has an engagement tip portion for supporting said annular member from inside the annular member, wherein said annular member is a cylindrical heater for positioning inside a gas tight container of a semiconductor single crystal pulling apparatus and comprises a plurality of vertical slits which are closed at least at the top end, said support arms being set longer than the radius of said heater, and wherein said engagement tip portions each comprises an engagement tongue at the extremity of each support arm, which slots into one of said vertical slits from inside the heater and engages at the top edge of the slit, and are made so as to be foldable only in an upwards direction.

2. An annular member hoist apparatus according to claim 1, wherein the length of said support arms can be adjusted.

3. An annular member hoist apparatus according to claim 2, wherein said engagement tongues have a locating protrusion which protrudes upwards proximate to either the internal surface or the external surface of the heater when the tongue is slotted into said vertical slit.

4. An annular member hoist apparatus according to claim 2, wherein said support arms comprise an arm base portion with a base end connected to said suspension member, and an arm tip portion which is connected to the extremity of the arm base portion, and said arm tip portion can be folded about a pivot point at the extremity of the arm base portion, in only an upward direction with respect to the arm base portion.

5. An annular member hoist apparatus according to claim 4, wherein said arm tip portions each have a fold stopper which protrudes from the top surface of the arm tip portion and which contacts the upper surface of said arm base portion when the arm tip portion is folded upwards, to thus control the extent of folding.

6. An annular member hoist apparatus according to claim 1, wherein said engagement tongues have a locating protrusion which protrudes upwards proximate to either the internal surface or the external surface of the heater when the tongue is slotted into said vertical slit.

7. An annular member hoist apparatus according to claim 6, wherein said support arms comprise an arm base portion with a base end connected to said suspension member, and an arm tip portion which is connected to the extremity of the arm base portion, and said arm tip portion can be folded about a pivot point at the extremity of the arm base portion, in only an upward direction with respect to the arm base portion.

8. An annular member hoist apparatus according to claim 7, wherein said arm tip portions each have a fold stopper which protrudes from the top surface of the arm tip portion and which contacts the upper surface of said arm base portion when the arm tip portion is folded upwards, to thus control the extent of folding.

9. An annular member hoist apparatus according to claim 1, wherein said support arms comprise an arm base portion with a base end connected to said suspension member, and an arm tip portion which is connected to the extremity of the arm base portion, and said arm tip portion can be folded about a pivot point at the extremity of the arm base portion, in only an upward direction with respect to the arm base portion.

10. An annular member hoist apparatus according to claim 9, wherein said arm tip portions each have a fold stopper which protrudes from the top surface of the arm tip portion and which contacts the upper surface of said arm base portion when the arm tip portion is folded upwards, to thus control the extent of folding.

* * * * *